US007564698B2

(12) United States Patent  
Oh

(10) Patent No.: US 7,564,698 B2
(45) Date of Patent: Jul. 21, 2009

(54) PLASMA DISPLAY DEVICE

(75) Inventor: Se-Il Oh, Suwon-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 936 days.

(21) Appl. No.: 10/913,709

(22) Filed: Aug. 5, 2004

(65) Prior Publication Data

US 2005/0068261 A1  Mar. 31, 2005

(30) Foreign Application Priority Data

Aug. 12, 2003  (KR)  ............... 10-2003-0055829

(51) Int. Cl.
*H05K 7/02* (2006.01)
*H05K 7/04* (2006.01)

(52) U.S. Cl. .................. 361/810; 361/807; 361/796; 361/818

(58) Field of Classification Search ................. 361/810, 361/807, 756, 727, 741, 686, 802, 600, 796, 361/818, 816; 439/377, 55, 76.1, 78–80, 439/928.1; 174/138
See application file for complete search history.

(56) References Cited

U.S. PATENT DOCUMENTS 4,739,452 A * 4/1988 Fukunaga ................... 361/756
6,118,028 A * 9/2000 Benson et al. .............. 568/655
6,198,222 B1 * 3/2001 Chang ........................ 313/582
6,288,489 B1   9/2001 Isohata et al.
6,735,093 B2 * 5/2004 Mu-Tsai ..................... 361/818
6,833,674 B2 * 12/2004 Kaneko et al. .............. 313/587
2006/0133046 A1 * 6/2006 Kim et al. ................... 361/714

FOREIGN PATENT DOCUMENTS

JP   2002-99218    4/2002
KR   1999-0076550  10/1999

OTHER PUBLICATIONS

Patent Abstract of Japan, Publication No. 2002-099218, Published Apr. 5, 2002, in the name of Nawata.

* cited by examiner

*Primary Examiner*—Hung S Bui
(74) *Attorney, Agent, or Firm*—Christie, Parker & Hale LLP

(57) ABSTRACT

At least one mounting member having a guide groove mounted on a side of a chassis base for supporting a plasma display panel, and at least one printed circuit board slidingly mounted along the guide groove. Such mounting of a printed circuit board enables enhancement of production efficiency. By forming a ground electrode on the PCB along a position contacting the guide groove, grounding of the PCB is enhanced and electromagnetic interference thereof is minimized.

4 Claims, 6 Drawing Sheets

PLASMA DISPLAY DEVICE

CROSS REFERENCE TO RELATED APPLICATIONS

This application claims priority to and the benefit of Korean Patent Application No. 2003-55829 filed on Aug. 12, 2003 in the Korean Intellectual Property Office, the entire content of which is incorporated herein by reference.

FIELD OF THE INVENTION

Generally, the present invention relates to a plasma display device. More particularly, the present invention relates to a plasma display device having an enhanced mounting structure of a printed circuit board to a chassis base.

BACKGROUND OF THE INVENTION

As is well known in the art, a plasma display device realizes a desired image using plasma discharge. Such a plasma display device generally includes a plasma display panel (PDP) for realizing the desired image through plasma discharge, which is activated by an external power source; a chassis base for firmly holding the PDP and for forming structural strength of a plasma display device; a driving circuit for driving the PDP; and a power supply circuit.

The driving circuit and the power supply circuit are mounted to the side opposite of the PDP on the chassis base. The side of the chassis base to which the PDP is mounted is called a front side, and the side of the chassis base to which the circuits are mounted is called a rear side.

The driving circuit and the power supply circuit, which include a plurality of circuital elements such as a resistor, a capacitor, and an integrated circuit (IC), are usually manufactured and mounted to the chassis base in the form of a printed circuit board (PCB).

FIG. 1 illustrates how a PCB is mounted to a chassis base according to the prior art.

As shown in FIG. 1, a plurality of mounting bosses 110 are formed at a rear side of chassis base 100, for mounting of PCB 150. Mounting holes 160 are formed at PCB 150 for engagement with mounting bosses 110. Screw fasteners 162 are engaged with bosses 110 through mounting holes 160 while mounting bosses 110 and mounting holes 160 are aligned, so PCB 150 becomes firmly mounted to chassis base 100.

For the grounding of circuits, PCB 150 has grounding holes 170 separate from mounting holes 160. Grounding bosses 120 corresponding to grounding holes 170 are formed at chassis base 100 and become tightly fitted to grounding holes 170. A copper land 172 is formed around grounding hole 170 of PCB 150, so the circuit on PCB 150 may be grounded through grounding boss 120.

According to a plasma display device of the prior art, production efficiency of a plasma display device may be deteriorated and production cost may be increased because numerous bosses including bosses 110 for mounting PCB 150 have to be formed at chassis base 100. Furthermore, mounting of PCB 150 to chassis base 100 is only enabled by screw-engaging many screw fasteners to the bosses.

Also according to a plasma display device of the prior art, PCB 150 is grounded through a few contact points between PCB 150 and chassis base 100, wherein connection between the contact points depends on contact between grounding bosses 120 and copper land 172 of grounding holes 170. Therefore, if the contact area between PCB 150 and chassis base 100 is increased, the grounding effect of PCB 150 may be enhanced and electromagnetic interference (EMI) by circuits of PCB 150 may be better shielded.

Because a chassis base must provide sufficient strength, research has been conducted to search for ways to strengthen the chassis base. An example of such research is found in Laid Open Japanese Patent publication 2002-099218 (filing no.: 2000-288523).

If the strength of a chassis base is enhanced the mechanical reliability of a plasma display device becomes efficiently enhanced.

SUMMARY OF THE INVENTION

The motivation for the present invention is to provide a plasma display device that allows for the easy mounting of a PCB to a chassis base, sufficient contact area between the PCB and the chassis base for grounding of the PCB, and enhanced strength of the chassis base.

An exemplary PDP according to an embodiment of the present invention includes a PDP a chassis base for supporting the PDP, a plurality of mounting members mounted on a side of the chassis base, and at least one PCB mounted to the chassis base via the plurality of mounting members, wherein at least one mounting member of the plurality of mounting members has a guide groove for guiding at least one PCB.

In a further embodiment, a ground electrode is formed on at least one side of the front and rear sides of the PCB at a position in contact with the guide groove.

In another further embodiment, at least one mounting member includes first and second mounting members across from, and generally parallel to, each other, the first and second mounting members respectively including first and second guide grooves, and the PCB is slidingly inserted along the first and second guide grooves.

In this case, a ground electrode may be formed on at least one side of the PCB at positions in contact with the first and second guide grooves. In particular, the ground electrode may be formed on at least one side of the front and rear sides of the PCB along edges inserted along the first and second guide grooves.

In yet another embodiment, at least one mounting member includes third and fourth mounting members, the third and fourth mounting members being inserted between the first and second mounting members and generally vertical thereto, the third and fourth mounting members being generally parallel to each other. Furthermore, at least one PCB includes, between the first and second mounting members, at least one first PCB inserted between the third and fourth mounting members and at least one second PCB inserted outside the area between the third and fourth mounting members.

In this case, a ground electrode may be formed on at least one side of the front and rear sides of the first and second PCB's at positions in contact with the first and second guide grooves.

In a still further embodiment, first and second fitting grooves are respectively formed at the third and fourth mounting members, wherein the first and second fitting grooves face a side of the chassis base, at least one second PCB is inserted into a fitting groove of the first and second fitting grooves, the ground electrode of the first PCB contacts the first and second mounting members, and the ground electrode of the second PCB respectively contacts at least one of the third and fourth mounting members and at least one of the first and second mounting members.

In this case, the ground electrode of the first PCB may be formed on at least one side of front and rear sides of the first PCB along edges inserted along the first and second guide grooves, and the ground electrode of the second PCB may be formed on at least one side of the front and rear sides of the second PCB along edges inserted along the first and second guide grooves and along an edge of at least one of the first or second fitting grooves.

In the above embodiments of the present invention, the ground electrode may be formed on the PCB along each edge thereof such that EMI may be maximally shielded.

In addition, in the above embodiments of the present invention, the ground electrode may be formed on the rear side of the PCB such that spatial usage of a PCB may be maximized.

DETAILED DESCRIPTION

Figure 1:
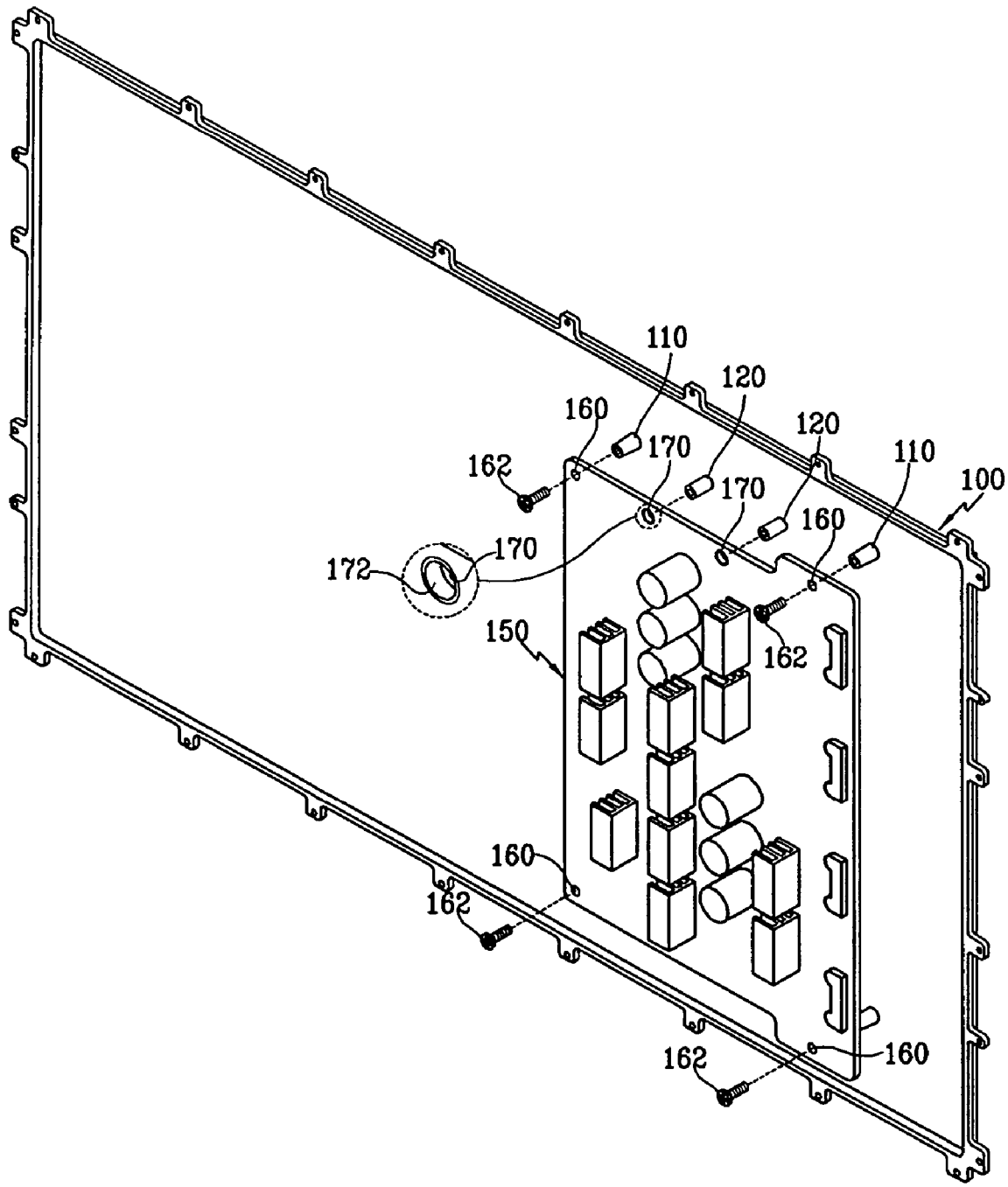
FIG. 1 illustrates how a PCB is mounted to a chassis base according to the prior art.
Figure 2:
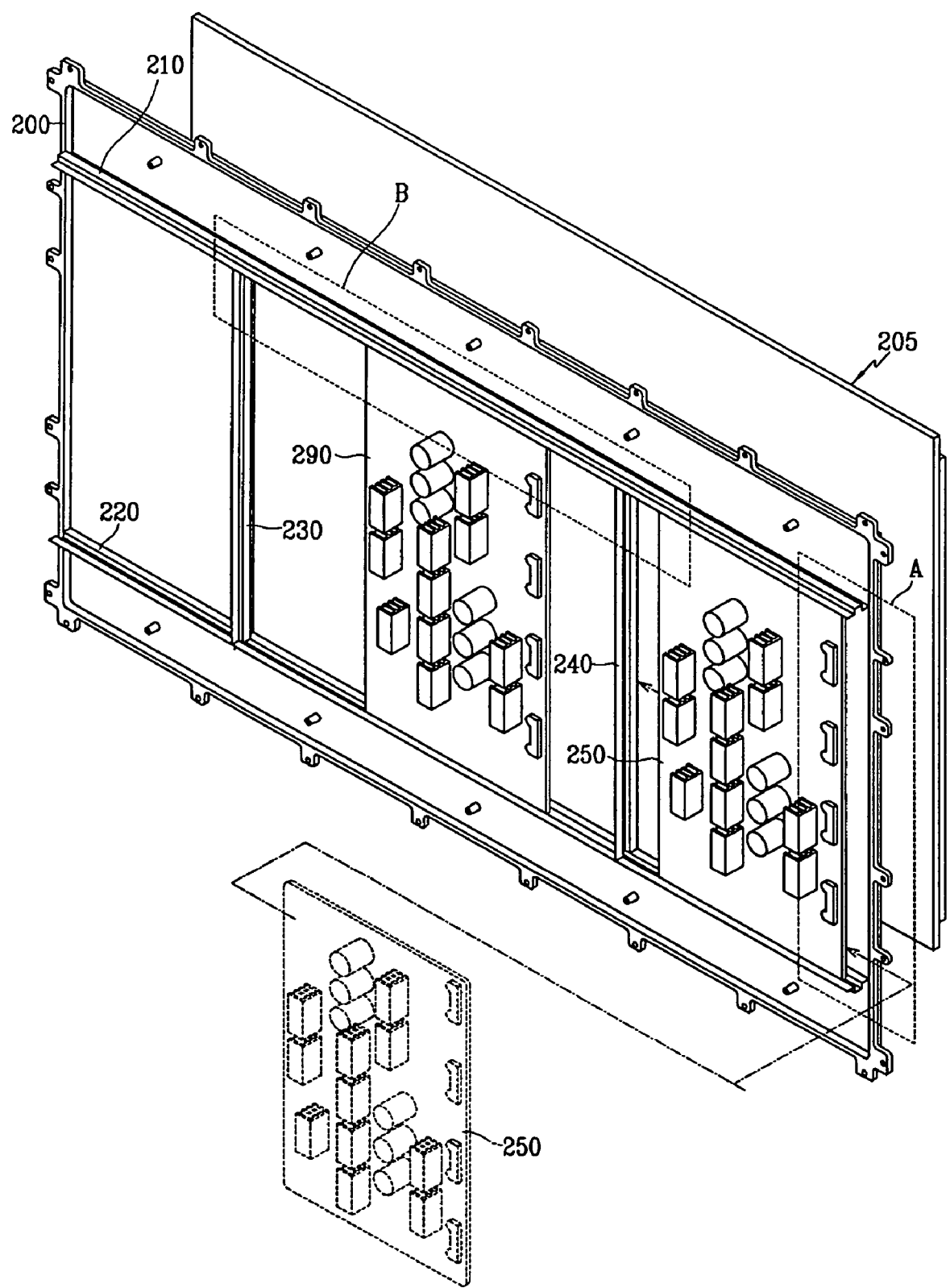
FIG. 2 is a perspective view of a plasma display device according to an embodiment of the present invention.

Referring to FIG. 2, a PDP according to an embodiment of the present invention includes PDP 205, chassis base 200 for supporting PDP 205, a plurality of mounting members 210, 220, 230, 240 mounted on a side of chassis base 200, and at least one PCB 250, 290 mounted to chassis base 200 via the plurality of mounting members 210, 220, 230, 240.

FIG. 2 illustrates first, second, third, and fourth mounting members 210, 220, 230, 240 as an example of the plurality of mounting members. However, the present invention should not be understood as limited to a specific number of mounting members.

Figure 3:
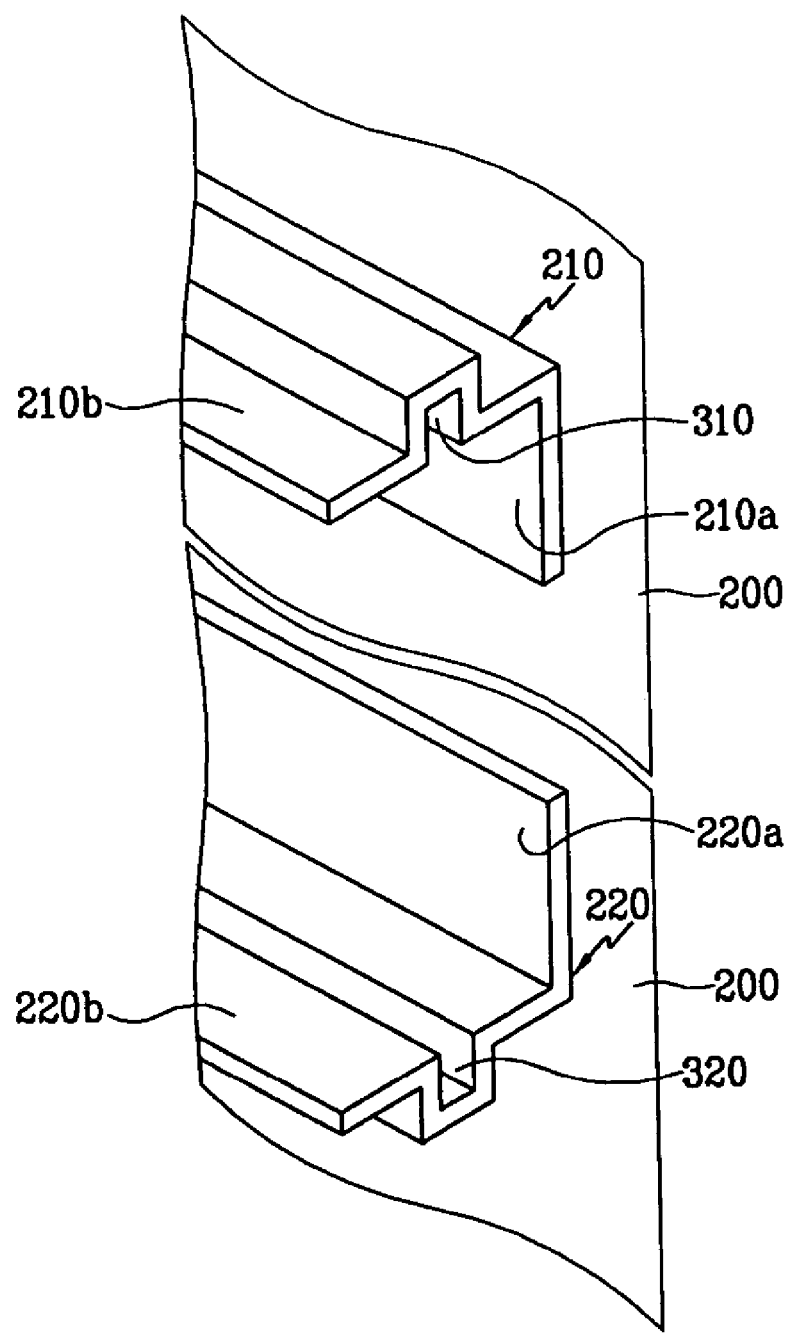
FIG. 3 is an enlarged perspective view of a portion A in FIG. 2.

At least one mounting member of the plurality of mounting members 210, 220, 230, 240 has a guide groove for guiding at least one PCB 250, 290. As shown in FIG. 3, first and second guide grooves 310, 320 are formed at first and second mounting members 210, 220 according to the present embodiment.

The method of attaching mounting members 210, 220, 230, 240 are mounted to chassis base 200 is not limited under an embodiment of the present invention. It is sufficient that mounting members 210, 220, 230, 240 are firmly attached to chassis base 200 by any attachment technique i.e., welding or by being integrally formed when the chassis base is manufactured.

First and second mounting members 210, 220 are attached opposite of each other and are generally parallel with each other. Therefore, as shown in FIG. 3, first and second guide grooves 310, 320 are also across from, and generally parallel to, each other. PCB's 250, 290 are slidingly inserted along such first and second guide grooves 310, 320.

First, second, third, and fourth mounting members 210, 220, 230, 240 are formed of a conductive material. Therefore, a contact to any of first, second, third, and fourth mounting members 210, 220, 230, 240 becomes electrically equivalent to a contact to chassis base 200. In addition, according to an embodiment of the present invention, chassis base 200 is used as an overall ground electrode.

Figure 4:
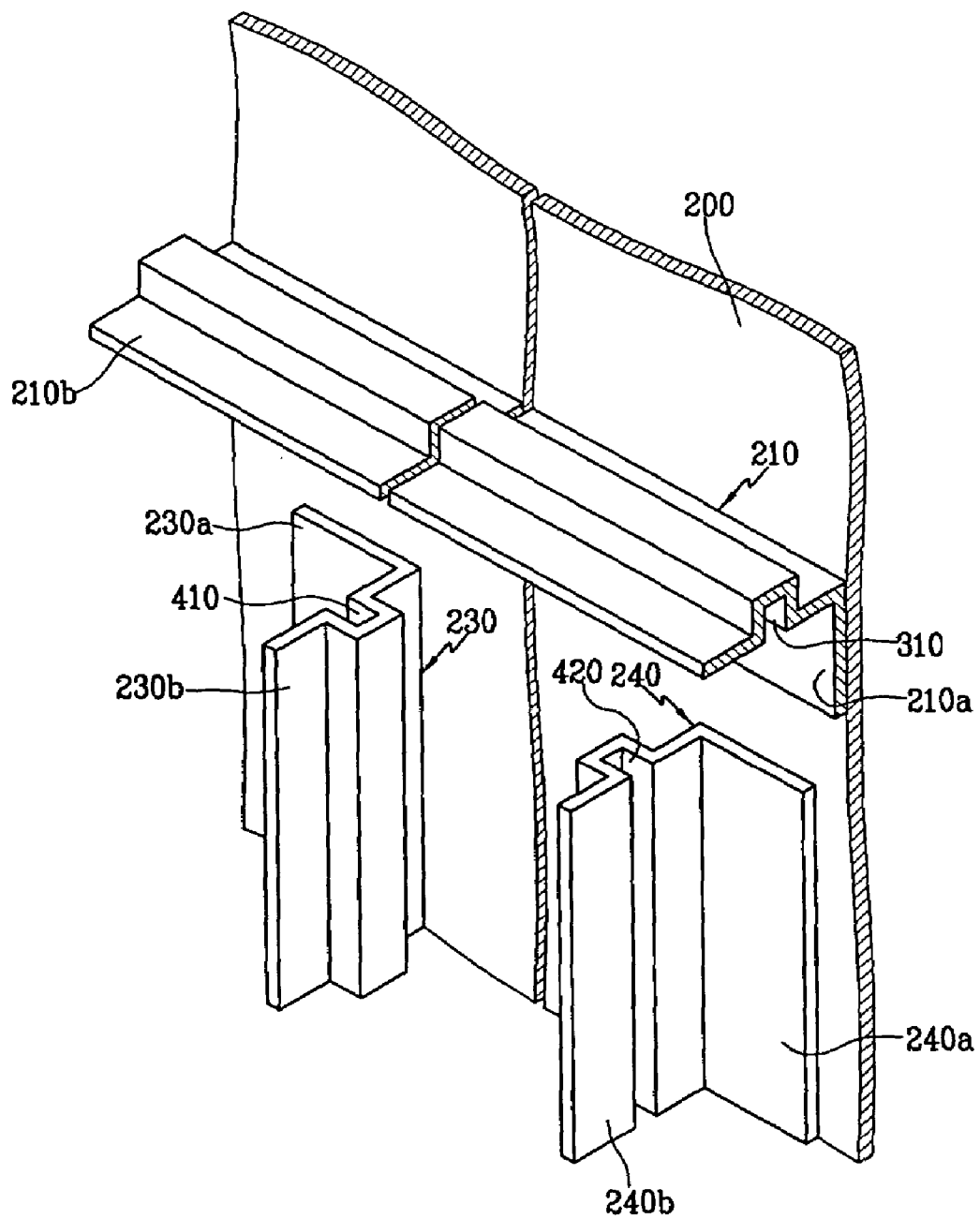
FIG. 4 is an enlarged perspective view of a portion B in FIG. 2.

In addition, as shown in FIGS. 3 and 4, first, second, third, and fourth mounting members 210, 220, 230, 240 respectively include bottom plates 210a, 220a, 230a, 240a fixed to chassis base 200 and vertical plates 210b, 220b, 230b, 240b generally vertical with respect to bottom plates 210a, 220a, 230, 240a. Vertical plates 210b, 220b, 230b, 240b are bent to form first and second guide grooves 310, 320 and first and second fitting grooves 410, 420.

As shown in FIG. 4, third and fourth mounting members 230, 240 are disposed between first and second mounting members 210, 220 and are generally vertical thereto. Third and fourth mounting members 230, 240 are generally parallel to each other.

First and second fitting grooves 410, 420 are respectively formed at third and fourth mounting members 230, 240, and face the sides of chassis base 200. Therefore, first and second fitting grooves 410, 420 are formed back-to-back and parallel to each other.

As a detailed example, FIG. 2 shows that a plurality of PCB's, for example the first and second PCB's 290, 250, are mounted to chassis base 200 by being inserted along first and second guide grooves 310, 320. In further detail, between first and second mounting members 210, 220, first PCB 290 is inserted between third and fourth mounting members 230, 240, and second PCB 250 is disposed exterior to fourth mounting member 240. Second PCB 250 is further inserted into second fitting groove 420 of fourth mounting member 240.

Figure 5:
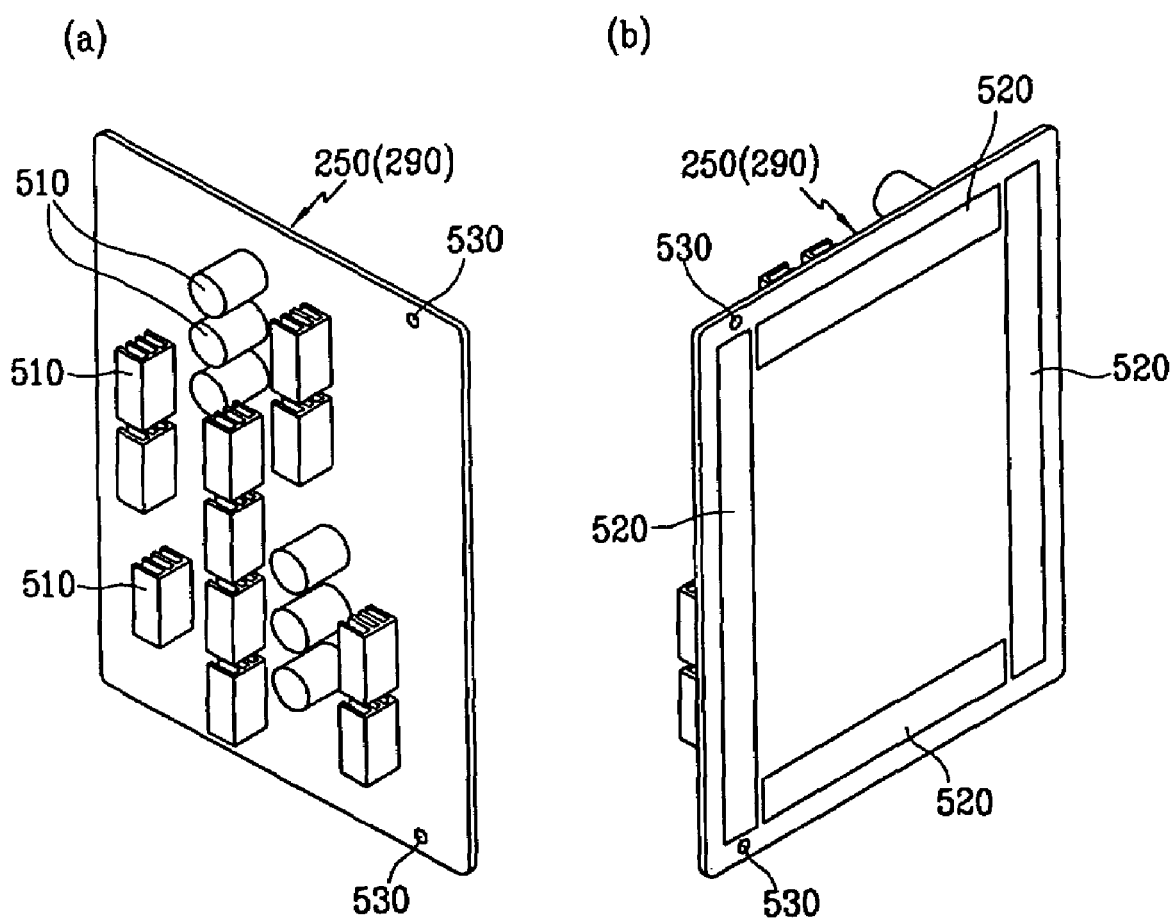
FIG. 5a is a perspective view showing a front side of a PCB of a plasma display device according to an embodiment of the present invention.
FIG. 5b is a perspective view showing a rear side of a PCB of a plasma display device according to an embodiment of the present invention.

As shown in FIG. 5a, various circuital elements 510 such as a resistor, a capacitor, and an integrated circuit (IC) are mounted on a front side of first and second PCB's 290, 250.

Mounting holes 530 are formed at first and second PCB's 290, 250 such that a screw fastener may pass through the holes.

As shown in FIG. 5b, ground electrode 520 is formed on a rear side of first and the second PCB's 290, 250. Ground electrode 520 may consist of a copper layer. As shown in FIG. 5b, ground electrode 520 may be formed along each edge of first and second PCB's 290, 250 on the rear side thereof. Ground electrode 520 formed along each edge of the PCB may have a generally rectangular shape as shown in FIG. 5b.

However, it is notable that the drawings show only examples of ground electrode 520 as being formed on the rear side of first and second PCB's 290, 250, and the scope of the present invention should not be understood as limited to that embodiment.

Regarding grounding of first PCB 290 between third and fourth mounting members 230, 240, it suffices that the ground electrode is formed along each edge inserted into first and second guide grooves 310, 320. Regarding a grounding of second PCB 250, it suffices that the ground electrode is formed along each edge inserted to first and second guide grooves 310, 320 and second fitting groove 420.

In addition, when an additional PCB (not shown) is disposed to the left in the drawing of third mounting member 230, it suffices that a ground electrode of the additional PCB is formed along each edge inserted into first and second guide grooves 310, 320 and first fitting groove 410.

Such a ground electrode of first PCB 290 respectively contacts first and second mounting members 210, 220, and such a ground electrode of second PCB 250 respectively contacts fourth mounting member 240 and first and second mounting members 210, 220.

First, second, third, and fourth mounting members 210, 220, 230, 240 and first and second PCB's 290, 250 may be mounted to chassis base 200, as discussed below.

First and second mounting members 210, 220 are mounted on chassis base 200, and then first PCB 290 is slidingly inserted along opposing first and second guide grooves 310, 320 of first and second mounting members 210, 220. Subsequently, third and fourth mounting members 230, 240 are mounted on chassis base 200, and then second PCB 250 is slidingly inserted along first and second guide grooves 310, 320. During mounting, second PCB 290 becomes inserted into second fitting groove 420 of fourth mounting member 240.

Figure 6:
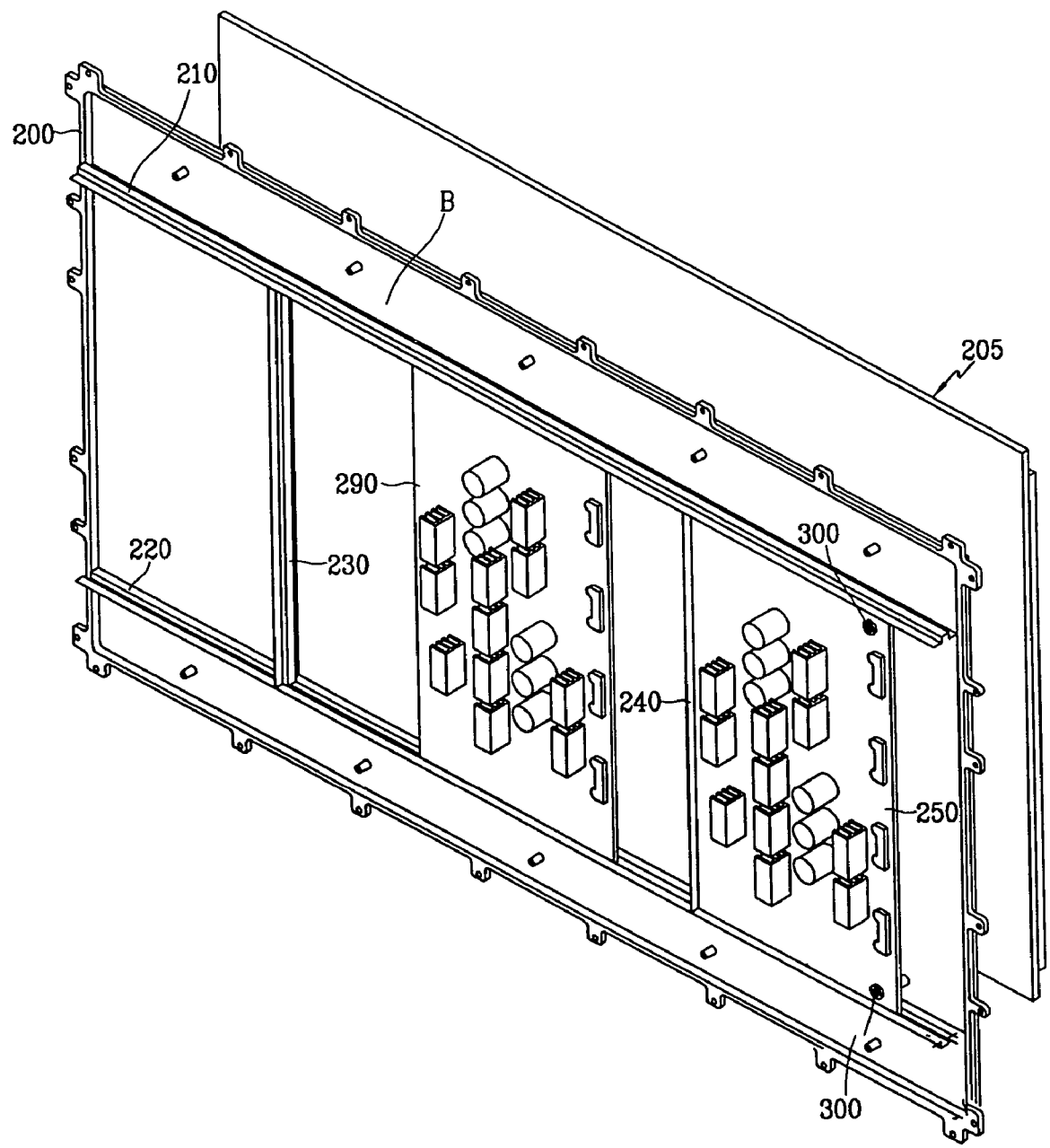
FIG. 6 illustrates that a PCB is attached with screws to a mounting member in a plasma display device according to an embodiment of the present invention.

First and second PCB's 290, 250 may be fixed to at least one of first, second, third, and fourth mounting members 210, 220, 230, 240 or to chassis base 200. According to an embodiment of the present invention, second PCB 250 (and also the first PCB although not shown) is fixed to chassis base 200 by inserting screw fastener 300 through the mounting hole 530 (refer to FIG. 5b), as shown in FIG. 6.

However, the scope of the present invention should not be understood to be limited to such a screw engagement, since PCB's 290, 250 may be fixed with chassis base 200 in various other manners, i.e., by tightly fitting first and the second PCB's 290, 250 to first and second mounting members 210, 220.

In the above description, PCB's 290, 250 are described to be slidingly engaged with chassis base 200 via mounting members. However, it is noted that a person of ordinary skill in the art would recognize that a different number of PCB's may be slidingly engaged therewith. For example, various numbers of PCB's may be slidingly mounted to chassis base 200 via the mounting members.

According to an embodiment of the present invention, a PCB is slidingly mounted to a chassis base, and accordingly, the number of bosses for mounting the PCB may be reduced. Therefore, the process for mounting a PCB may be simplified and production efficiency of a plasma display device is thereby enhanced.

In addition, since the ground electrode is formed on the surface of a PCB side, the contact area between the ground electrode and the PCB is increased and grounding of a PCB is more ensured. Furthermore, a ground electrode of a surface shape may also reduce EMI of a PCB.

A PCB is firmly attached to the chassis because first and second mounting members respectively having first and second guide grooves are attached across, and generally parallel to, each other, and the PCB is inserted along the first and second guide grooves. In this case, grounding of the PCB may be enhanced since a ground electrode is formed on the PCB such that it contacts each of the guide grooves. In particular, when the ground electrode is formed along each edge of the PCB, grounding is enhanced and EMI is reduced.

According to an embodiment of the present invention, third and fourth mounting members are included between the first and second mounting members such that the third and fourth mounting members are generally vertical to the first and second mounting members and generally parallel to each other. Therefore, PCB's may be disposed both between the third and fourth mounting members and exterior thereto. In this case, the third and fourth mounting members may respectively have fitting grooves such that a PCB may be inserted. Therefore, grounding, prevention of loosening, and shielding EMI of the PCB may be simultaneously enhanced.

The ground electrode may be formed on a rear side of such a PCB, and in this case, utility of a front side of the PCB on which circuital elements are mounted may be enhanced.

In an embodiment of the present invention, the mounting members are bent to form bottom and vertical plates and the vertical plates are further bent to form grooves, which enhances the strength of the chassis base.

While this invention has been described in connection with what is presently considered to be the most practical and exemplary embodiment, it is to be understood that the invention is not limited to the disclosed embodiments, but, to the contrary, is intended to cover various modifications and equivalent arrangements included within the spirit and scope of the appended claims.

What is claimed is:

1. A plasma display device comprising:
a plasma display panel;
a chassis base for supporting the plasma display panel;
a plurality of mounting members mounted on the chassis base comprising:
  a first mounting member and a second mounting member opposing and generally parallel to each other, the first mounting member and the second mounting member including a first guide groove and a second guide groove, respectively, for guiding a printed circuit board; and
  a third mounting member and a fourth mounting member being generally parallel to each other, the third mounting member and the fourth mounting member being between and generally perpendicular to the first mounting member and the second mounting member, the third mounting member and the fourth mounting member including a first fitting groove and a second fitting groove, respectively; and
a plurality of printed circuit boards mounted to the chassis base via the first guide groove and the second guide groove of the plurality of mounting members, the plurality of printed circuit boards comprising a first printed circuit board in a first area defined by the first mounting member, the second mounting member, the third mounting member and the fourth mounting member, and a second circuit board being in a second area outside the first area and between the first mounting member and the second mounting member and fitted into one of the first fitting groove or the second fitting groove; wherein the first printed circuit board includes a first ground electrode contacting the first guide groove and the second guide groove and wherein the second printed circuit board includes a second ground electrode contacting at least one of the first mounting member or the second mounting member and at least one of the third mounting member or the fourth mounting member.

2. The plasma display device of claim 1, wherein:
the first ground electrode extends adjacent to an edge of the first printed circuit board fitted into the first guide groove and the second guide groove; and
the second ground electrode extends adjacent to an edge of the second printed circuit board fitted into at least one of the first fitting groove or the second fitting groove.

3. The plasma display device of claim 1, wherein the first ground electrode and the second ground electrode extend adjacent to an edge of the first printed circuit board and the second printed circuit board, respectively.

4. The plasma display device of claim 1, wherein each of the plurality of printed circuit boards includes a rear side facing the chassis base and wherein the first ground electrode is on the rear side of the first printed circuit board and the second ground electrode is on the rear side of the second printed circuit board.

* * * * *